(12) United States Patent
Kimata et al.

(10) Patent No.: US 6,576,556 B2
(45) Date of Patent: Jun. 10, 2003

(54) METHOD OF MANUFACTURING SEMICONDUCTOR DEVICE AND METHOD OF MANUFACTURING INFRARED IMAGE SENSOR

(75) Inventors: Masafumi Kimata, Tokyo (JP); Yoshiyuki Nakaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/917,277

(22) Filed: Jul. 30, 2001

(65) Prior Publication Data

US 2002/0034878 A1 Mar. 21, 2002

(30) Foreign Application Priority Data

Sep. 21, 2000 (JP) .................................... 2000-286518
Jan. 23, 2001 (JP) ..................................... 2001-013948

(51) Int. Cl.[7] ........................................... H01L 21/311
(52) U.S. Cl. ..................... 438/700; 438/702; 438/706
(58) Field of Search ................... 438/700, 701, 438/702, 704, 706, 723, 725, 745, 756

(56) References Cited

U.S. PATENT DOCUMENTS

| | | | | |
|---|---|---|---|---|
| 4,638,345 A | * | 1/1987 | Elabd et al. | ............... 257/451 |
| 5,120,960 A | * | 6/1992 | Halvis | ..................... 250/338.4 |
| 5,541,412 A | * | 7/1996 | Tanaka et al. | ............... 250/332 |
| 5,589,687 A | * | 12/1996 | Kawata et al. | ........... 250/338.3 |
| 5,670,382 A | * | 9/1997 | Ishizuya et al. | ............... 438/60 |
| 5,726,480 A | | 3/1998 | Pister | |
| 6,031,231 A | | 2/2000 | Kimata et al. | |
| 6,165,587 A | * | 12/2000 | Nonaka | ....................... 428/119 |

OTHER PUBLICATIONS

U.S. patent application Ser. No. 09/581,808, filed Dec. 18, 1997.

Ishikawa et al., "Low-cost 320 × 240 Uncooled IRFPA Using Conventional Silicon IC Process", SPIE Conference on Infrared Technology and Applications XXV, vol. 3698, Apr. 1999, pp. 556–564.

Lee et al., "A High Fill-Factor IR Bolometer Using Multi-Level Electrothermal Structures", Technical Digest of IEEE International Electron Devices, 1998, pp. 463–466.

* cited by examiner

*Primary Examiner*—Kin-Chan Chen
(74) *Attorney, Agent, or Firm*—Leydig, Voit & Mayer, Ltd.

(57) ABSTRACT

A method of manufacturing an infrared image sensor in which an etching gas is introduced through etching holes into a semiconductor substrate to form a hollow portion. The etching gas is introduced only through an etching hole in a splicing pillar when etching is started. This method provides an etching configuration which has a largest depth right beneath the splicing pillar and which becomes shallower toward ends of the substrate, and therefore there is no need for forming deep etching stoppers.

18 Claims, 12 Drawing Sheets

METHOD OF MANUFACTURING SEMICONDUCTOR DEVICE AND METHOD OF MANUFACTURING INFRARED IMAGE SENSOR

BACKGROUND OF THE INVENTION

1. Field of the Invention

The present invention relates to a method of manufacturing a semiconductor device which is aimed at forming a three-dimensional structure having a space therein and, more particularly, to a method of manufacturing an infrared image sensor.

2. Description of the Related Art

A description is given of a conventional method of manufacturing a semiconductor device to which the invention relates with reference to a structure of a pixel of an uncooled infrared image sensor as an example. FIG. 14A is a cross sectional view showing a structure of a unit element or a pixel of an uncooled infrared image sensor that is a type disclosed in Japanese Laid-Open Patent Publication 209418/1998 or Proceedings of SPIE, No. 3698, pp. 556–564 in which an infrared ray absorbing portion for absorbing infrared rays to increase the temperature of a photodetector portion and a temperature detecting portion that forms a temperature sensor to detect the temperature rise are formed as separate structures. FIG. 14B is a plane view of the structure shown in FIG. 14A with the infrared ray absorbing portion removed. FIG. 14A is a cross sectional view along the line XIVA—XIVA in FIG. 14B taken before removing the infrared ray absorbing portion.

FIGS. 14A and 14B omit a signal readout circuit which is formed on a silicon substrate 1, as it is not directly related to the invention. In those figures, reference numeral 1 represents a silicon substrate; reference numeral 10 represents a temperature detecting portion which is supported above a hollow portion 200 provided in the silicon substrate 1 with support legs 21 and 22; reference numeral 11 represents a temperature sensor constituted by a bolometer or the like for detecting a temperature change; reference numeral 12 represents an insulating film constituted by a silicon dioxide film or the like that covers the temperature sensor 11; and reference numerals 13 and 14 represent metal wirings for readout of signals from the temperature sensor 11. The support legs 21 and 22 are constituted by insulating films that are silicon dioxide films 23 and 24 similar to that of the temperature detecting portion, and metal wirings 25 and 26 are provided in the insulating films. Reference numeral 130 represents an infrared ray absorbing portion for absorbing infrared rays and converting them into heat, and reference numeral 140 represents a splicing pillar for holding the infrared ray absorbing portion at a certain interval from the temperature detecting portion 10 and for thermally integrating the infrared ray absorbing portion 130 and temperature detecting portion 10. Reference numerals 31 and 32 represent insulating films constituted by silicon dioxide films or the like formed on the substrate 1, and reference numerals 33 and 34 represent metal wirings formed in the insulating films 31 and 32.

An operation of a pixel of the uncooled infrared image sensor will now be described. Infrared rays impinge upon the infrared ray absorbing portion 130. The incident infrared rays are absorbed by the infrared ray absorbing portion 130 to increase the temperature of the infrared ray absorbing portion 130. The temperature change of the infrared ray absorbing portion 130 is conducted to the temperature detecting portion 10 through the splicing pillar 140 to increase the temperature of the temperature detecting portion 10. The splicing pillar 140 is designed such that it has thermal resistance lower than that of the support legs 21 and 22. A time constant determined by the total thermal capacity of the three structures, that is, temperature detecting portion 10, splicing pillar 140 and infrared ray absorbing portion 130, and the thermal resistance of the support legs 21 and 22 is shorter than a frame time during which the uncooled infrared image sensor operates. Since the support legs 21 and 22 are designed such that they have thermal conductance sufficiently lower than that of the splicing pillar 140, the temperature rise at the temperature detecting portion 10 substantially coincides with the temperature rise at the infrared ray absorbing portion 130. It is therefore possible to detect infrared rays by measuring the temperature rise with the temperature sensor 11.

A method of manufacturing the pixel structure shown in FIGS. 14A and 14B will now be with reference to FIGS. 15 through 19.

A signal readout circuit (not shown) is firstly formed on a silicon substrate 1 having a (100)-plane orientation, and an insulating film 2 (which will become insulating films 12, 23, 24, 31 and 32 at the next step), metal wirings 13, 14, 25, 26, 33 and 34 and a temperature sensor 11 are thereafter formed (see FIG. 15).

Subsequently, etching holes 41, 42, 43, and 44 for forming a hollow portion in the silicon substrate 1 are formed by means of etching in the insulating film 2 which is constituted by a silicon dioxide film; a sacrificial layer 110 made of amorphous silicon or the like which is to be removed at a later step is thereafter formed on the wafer; photolithography and etching techniques are then used to form a hole penetrating through the sacrificial layer 110 in a region of the sacrificial layer 110 where a splicing pillar is to be formed; and the hole is filled with a material which will become a splicing pillar 140 (see FIG. 16).

The above-described step separates the insulating film 2 into regions 12, 23, 24, 31 and 32. At this step, it is preferable to flatten the top surface using an etch-back technique, CMP (chemical mechanical polishing) or the like. The splicing pillar 140 may be constituted by the same material that constitutes an infrared ray absorbing portion 130 as disclosed in Japanese Laid-Open Patent Publication 209418/1998, and the infrared ray absorbing portion 130 is formed concurrently with the splicing pillar 140 in this case.

A thin film to become the infrared ray absorbing portion 130 is formed on the sacrificial layer 110 and is patterned into a separated infrared ray absorbing portion for each pixel (see FIG. 17

The sacrificial layer 110 is etched from an opening around the infrared ray absorbing portion 130 to separate the infrared absorbing portion 130 above the substrate 1 with the splicing pillar 140 left between them (see FIG. 18).

The silicon substrate 1 is etched from the exposed regions of the silicon substrate 1 at the bottom of the etching holes 41, 42, 43 and 44. As a result, a hollow portion 200 is formed in the silicon substrate 1 (see FIG. 19).

When the sacrificial layer 110 is formed of amorphous silicon, the sacrificial layer 110 and the silicon substrate 1 can be simultaneously etched. When the silicon is etched using an etchant, such as potassium hydroxide (KOH), tetramethyl ammonium hydroxide (TMAH), or the like, the etching rate decreases as (111)-crystal planes are exposed in so-called anisotropic etching. It is therefore possible to form an etched section having a configuration as shown in FIG. 19 without expanding the surface configuration of the hollow portion 200 beyond a certain size by using a silicon substrate whose surface is a (100)-plane which is commonly used for MOS (metal oxide semiconductor) and CMOS (complimentary metal oxide semiconductor) devices.

While the removal of the sacrificial layer 110 and the formation of the hollow portion 200 in the silicon substrate 1 is carried out using an etchant, that is, using a wet process in the above-described example of the prior art, such a wet process had a possibility of deformation of a constituent part of a pixel attributable to the surface tension of a residue of the liquid on the surface of the pixel structure at the final drying step. For example, there is a high possibility of a problem referred to as "sticking" in which the silicon substrate 1 stays in contact with the infrared ray absorbing layer 130 and insulating film 2 that cover the same, and the occurrence of this problem has significantly reduced yield.

As a countermeasure against this, it is preferable to use a dry process, i.e., etching using a gas such as $XeF_2$. Dry etching utilizing an etching gas of this type was isotropic, and the etching gas introduced into the silicon substrate 1 through the etching holes 41 through 44 dry-etched the silicon substrate 1 into a configuration (see FIG. 20).

FIG. 21 is a cross sectional configuration obtained by isotropic dry etching of the structure shown in FIG. 20 in which pixels are two-dimensionally arranged. The arrows in FIG. 21 indicate paths for introduction of an etching gas. As a result of such isotropic etching, the hollow portion 200 in the silicon substrate 1 of each pixel is expanded in the lateral direction and may be connected to the hollow portions of adjacent pixels in the worst case, which has disabled formation of each pixel.

In order to solve such a problem, Japanese Laid-Open Patent Publication 209418/1998 proposed a method in which an etching stopper having a trench structure is formed in a silicon substrate. In this case, however, when etching is performed until the bottom surface of the temperature detecting portion is completely covered by a hollow, a deep etching stopper is required because etching most actively proceeds directly under each of the etching holes to etch the periphery of the hollow portion deeper.

Further, Japanese Laid-Open Patent Publication 209418/1998 disclosed a method in which an etching hole 401 is provided also in the vicinity of the centers of the infrared ray absorbing portion 130 and temperature detecting portion 11 (see FIG. 22). This method also has a problem in that the neighborhood of etching stoppers 301 and 302 is etched deeply because the etching gas is introduced to the peripheral region through the etching holes 41 through 44 to promote etching in that region.

As described above, according to the prior art, when the removal of the sacrificial layer 110 and the formation of the hollow portion 200 in the silicon substrate 1 is carried out using wet etching, sticking can be caused by the surface tension of the liquid that is left on the surface of the pixel structure at the final step of drying the device.

On the other hand, when dry etching is performed using an etching gas such as $XeF_2$, a plurality of regions are etched in association with the positions of etching holes according to the conventional manufacturing method, and the etching most actively proceeds directly under each of the etching holes. This results in a need for limiting the progress of the etching in the lateral direction.

Even when the etching hole 401 that penetrates from the surface through the infrared ray absorbing portion 130, the interior of the splicing pillar 140 and the insulating film 12 is provided to cause dry etching to start at the region directly under the splicing pillar, the dry etching simultaneously proceeds also from the etching holes 41 through 44 in the peripheral region to most actively etch the region directly under each of the etching holes. This results in a need for limiting the progress of the etching in the lateral direction.

Further, since the progress of dry etching may be uneven across a wafer or from wafer to wafer, a deep etching stopper must be provided in sufficient consideration to a margin for manufacture for the purpose of manufacture with high yield. The formation of such a deep etching stopper results in a reduction of yield because of an increase in the etching time attributable to the formation of a deep trench, the difficulty of etching with a high aspect ratio and the difficulty of the formation of an embedded trench that makes it difficult to perform fabrication with high reproducibility.

Further, when the etching rate significantly varies across a wafer or from wafer to wafer, production is quite difficult because a very deep etching stopper is required.

SUMMARY OF THE INVENTION

A method of manufacturing a semiconductor device having a plurality of unit element regions according to the invention has the steps of: forming an etching stopper portion embedded in a semiconductor substrate for each unit element region; the etching stopper portion located at a predetermined distance from the center of the unit element region; forming a first structure on a surface of the semiconductor substrate in the unit element region; forming at least one first etching hole in the first structure located in between the neighborhood of center of the first structure and the location of the etching stopper portion, the first etching hole penetrating the first structure to reach the semiconductor substrate; forming a sacrifice layer on the first structure; forming at least one splicing pillar which penetrates the sacrifice layer to reach the first structure; forming a second structure on the sacrifice layer; forming a second etching hole which penetrates the second structure, the splicing pillar and the first structure to reach the semiconductor substrate, the second etching hole being along with the central axis of the splicing pillar; introducing an etching gas through the second etching hole to etch the semiconductor substrate thereby forming a hollow portion which is configured such that it has a largest depth right beneath the splicing pillar, gradually becomes shallower toward the etching stopper portion and has smallest depth where the hollow portion is in contact with the etching stopper portion; sequentially etching the sacrifice layer with the etching gas which is supplied through the first etching hole from the hollow portion concurrently with progress of etching of the semiconductor substrate.

The method may further comprise the steps of: forming a third etching hole whose bottom reaches the sacrifice layer through said infrared absorbing portion; and introducing an etching gas through the second etching hole to etch the semiconductor substrate thereby forming a hollow portion and simultaneously introducing an etching gas through the third etching hole to etch the sacrifice layer.

A method of manufacturing an infrared image sensor having a plurality of unit element regions according to the invention has the steps of: forming an etching stopper portion embedded in a semiconductor substrate for each unit element region, the etching stopper portion located at a predetermined distance from the center of the unit element region; forming an insulating film portion having a metal wiring and a temperature sensor embedded therein, on a surface of the semiconductor substrate in the unit element region; forming at least one first etching hole in the insulating film portion located in between the neighborhood of center of the insulating film portion and the location of the etching stopper portion, the first etching hole penetrating the insulating film portion to reach the semiconductor substrate; forming a sacrifice layer on the insulating film portion; forming at least one splicing pillar which penetrates the sacrifice layer to reach the insulating film portion; forming an infrared absorbing portion on the sacrifice layer; forming a second etching hole which penetrates the infrared absorbing portion, the splicing pillar and the insulating film portion to reach the semiconductor substrate, the second etching hole being along with the central axis of the splicing pillar; introducing an etching gas through the second etching hole to etch the semiconductor substrate thereby forming a hollow portion which is configured such that it has a largest depth right beneath the splicing pillar, gradually becomes shallower toward the etching stopper portion and has smallest depth where the hollow portion is in contact with the etching stopper portion; sequentially etching the sacrifice layer with the etching gas which is supplied through the first etching hole from the hollow portion concurrently with progress of etching of the semiconductor substrate.

DETAILED DESCRIPTION OF THE PREFERRED EMBODIMENTS

First Embodiment

Figure 1:
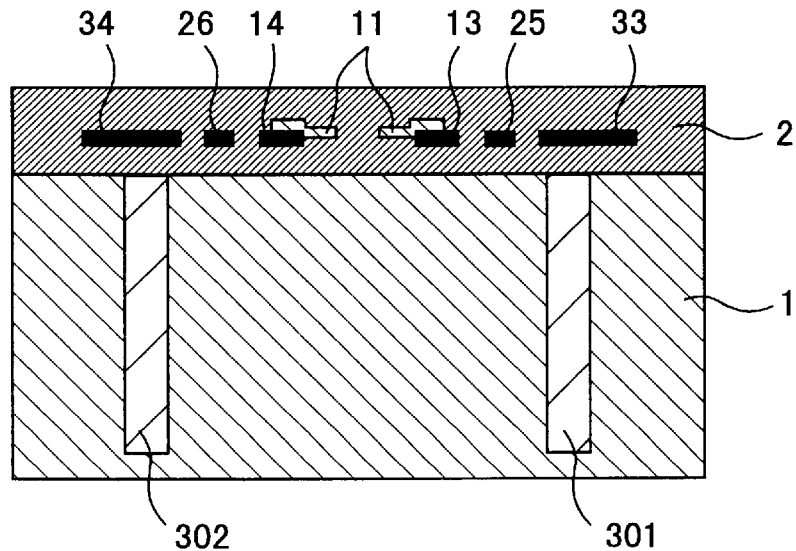
FIGS. 1–7 are cross sectional views of a pixel structure of an uncooled infrared image sensor showing parts of a flow of manufacture of a semiconductor device according to a first embodiment of the invention.

FIGS. 1 through 7 show a method of manufacturing a semiconductor device according to a first embodiment of the invention. A unit element or a pixel structure of an uncooled infrared image sensor will now be described as a specific example of a semiconductor device according to the first embodiment. In those figures, reference numeral 1 represents a silicon substrate; reference numeral 2 represents an insulating film constituted by a silicon dioxide film; reference numeral 11 represents a temperature sensor constituted by a bolometer or the like for detecting a temperature change; reference numeral 12 represents an insulating film constituted by a silicon dioxide film or the like that covers the temperature sensor 11; and reference numerals 13 and 14 represent metal wirings for readout of signals from the temperature sensor 11. Reference numerals 23 and 24 represent insulating films constituted by silicon dioxide films or the like, and metal wirings 25 and 26 are provided in the insulating films. Reference numerals 31 and 32 represent insulating films constituted by silicon dioxide films formed on the silicon substrate 1, and reference numerals 33 and 34 represent metal wirings formed in the insulating films 31 and 32. Reference numeral 110 represents a sacrifice layer; reference numeral 130 represents an infrared ray absorbing portion for absorbing infrared rays and converting them into heat, and reference numeral 140 represents a splicing pillar for thermally coupling the infrared ray absorbing portion 130 and temperature detecting portion 11.

First, a groove or trench is provided by means of dry etching in a predetermined position of the silicon substrate 1, and a silicon dioxide film is formed using CVD (chemical vapor deposition). Thereafter, the surface of the silicon substrate 1 is flattened by removing the silicon dioxide film on the same using CMP or the like to form etching stoppers 301 and 302. A signal readout circuit (not shown) is formed on the wafer which has been subjected to such a process and, thereafter, an insulating film 2 (which will become insulating films 12, 23, 24, 31 and 32 at the next step), metal wirings 13, 14, 25, 26, 33 and 34 and a temperature sensor 11 which collectively form a first structure are formed (see FIG. 1).

Subsequently, the first etching holes 41, 42, 43 and 44 for forming a hollow portion 200 in the silicon substrate 1 are formed by means of etching in the insulating film 2 which is constituted by a silicon dioxide film, and a sacrifice layer 110 made of amorphous silicon or the like is thereafter formed thereon. The shapes of the first etching holes are the rectangular ones. The sacrifice layer 110 is completely removed at a later step.

Figure 2:
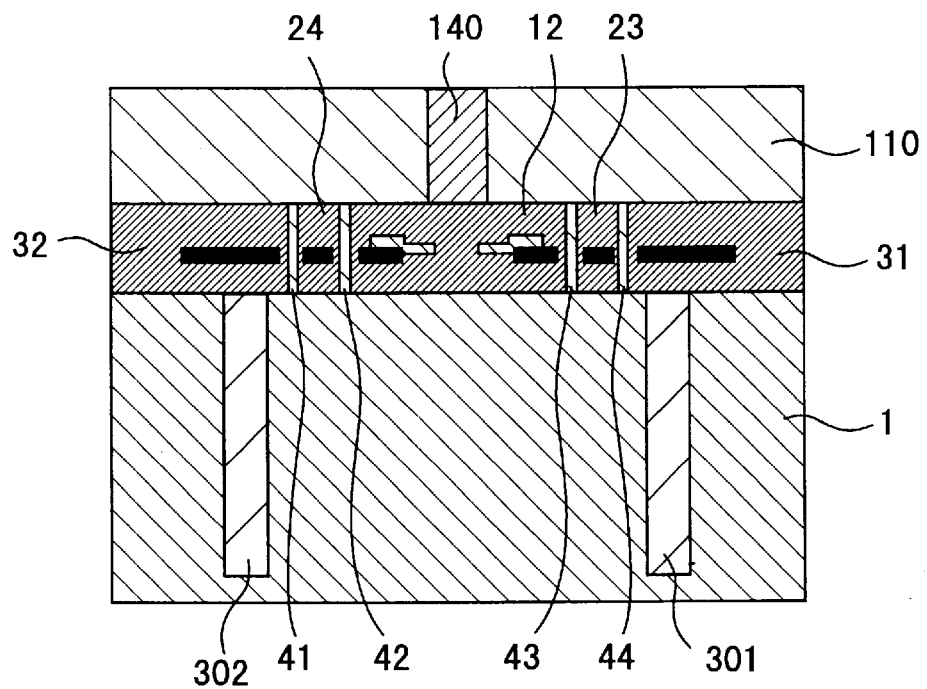

Photolithography and etching techniques are then used to form a hole penetrating through the sacrifice layer 110 in a region of the sacrifice layer 110 where a splicing pillar is to be formed, and the hole is filled with a material which will become a splicing pillar 140 (see FIG. 2).

The above-described step separates the insulating film 2 into regions 12, 23, 24, 31 and 32. At this step, it is preferable to flatten the top surface using an etch-back technique, CMP or the like. The splicing pillar 140 may be constituted by the same material that constitutes an infrared ray absorbing portion 130 as disclosed in Japanese Laid-Open Patent Publication 209418/1998, and the infrared ray absorbing portion 130 is formed concurrently with the splicing pillar 140 in this case.

Figure 3:
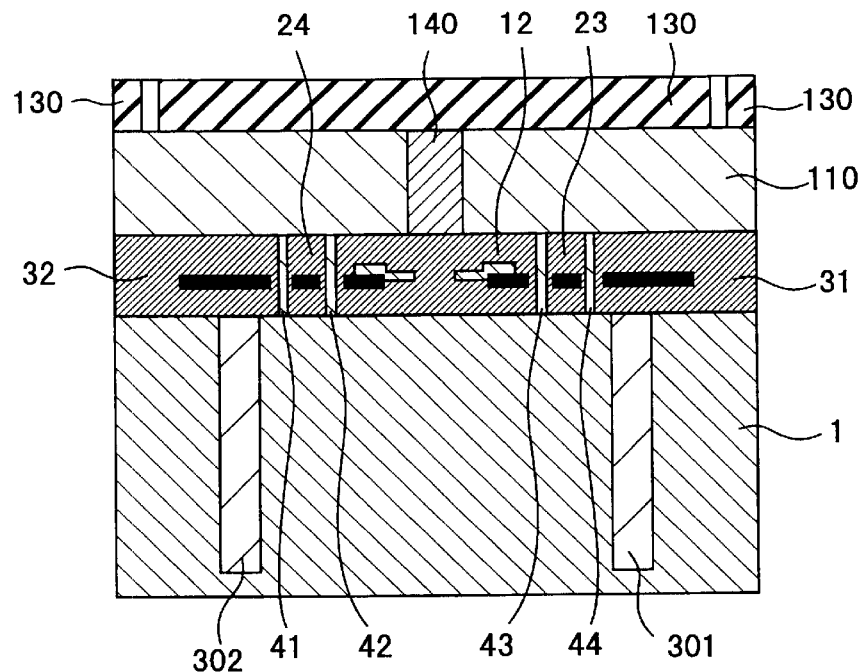
Figure 4:
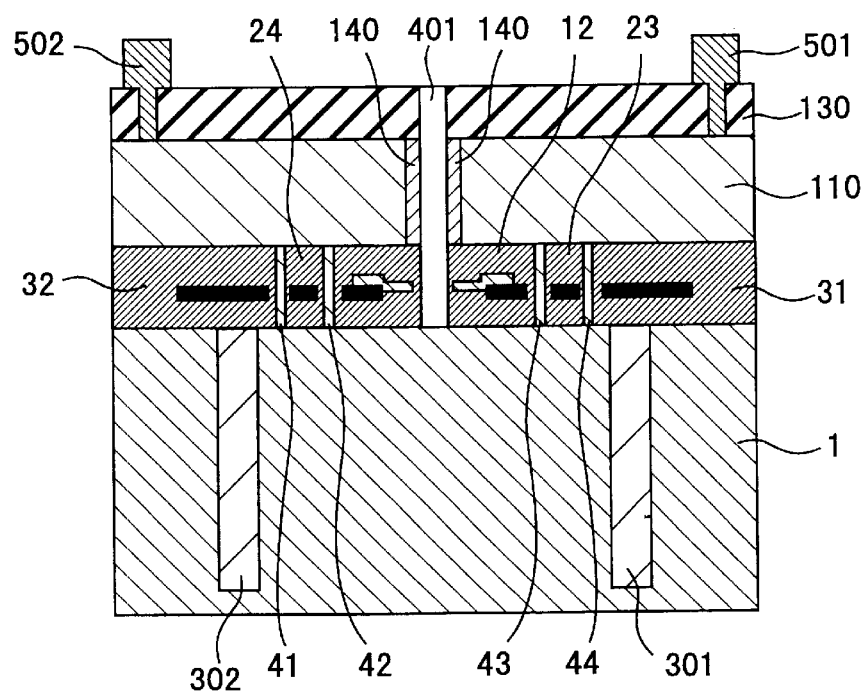
Figure 5:
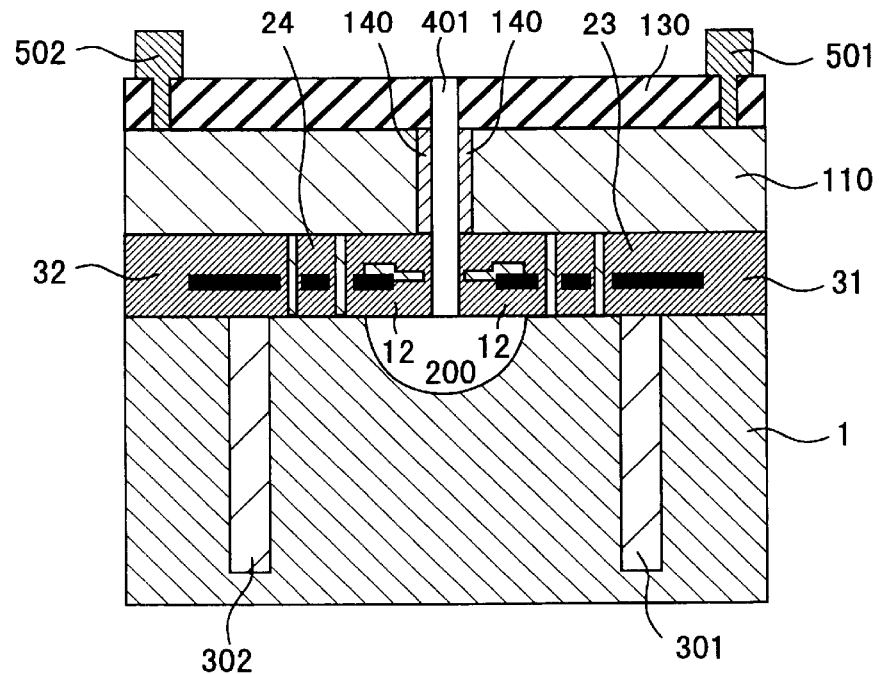

A thin film to become the infrared ray absorbing portion 130 which is a second structure is formed on the sacrifice layer 110 and is patterned into an individual infrared ray absorbing portion for each pixel (see FIG. 3).

Next, in order to etch a part of the silicon substrate 1 at a later step, a second etching hole 401 penetrating through the infrared ray absorbing portion 130, splicing pillar 140 and insulating film 12 are formed. At this time, protective films 501 and 502 are formed to cover peripheral regions of the infrared ray absorbing portion 130 where the sacrifice layer 110 is exposed.

In conventional structures, the sacrifice layer 110 is also etched from spaces for separating pixels provided at the peripheral regions of the infrared ray absorbing portion 130 concurrently with the etching of the splicing pillar 140. In the first embodiment, on the contrary, since the exposed regions at the periphery are covered with the protective films 501 and 502 made of resist or polyimide, the sacrifice layer 110 is not etched at this step (see FIG. 4).

An etching gas is introduced through the etching hole 401 in the above-described splicing pillar 140 to etch the silicon substrate 1. Since such dry etching in the silicon substrate 1 is isotropic, the etching proceeds to a largest depth right beneath the splicing pillar 140 (see FIG. 5).

An etching gas such as $XeF_2$ is used for the above-described dry etching. The reason is that such an etching gas is characterized in that it causes isotropic etching.

Etching gases other than $XeF_2$ include $XeF_4$, $XeF_6$, $KrF_2$, $KrF_4$ and $KrF_6$ which are fluorides of noble gases that allow isotropic etching of silicon and $ClF_3$, $BrF_3$, $BrF_5$, $IF_5$ and the like which are halides.

Figure 6:
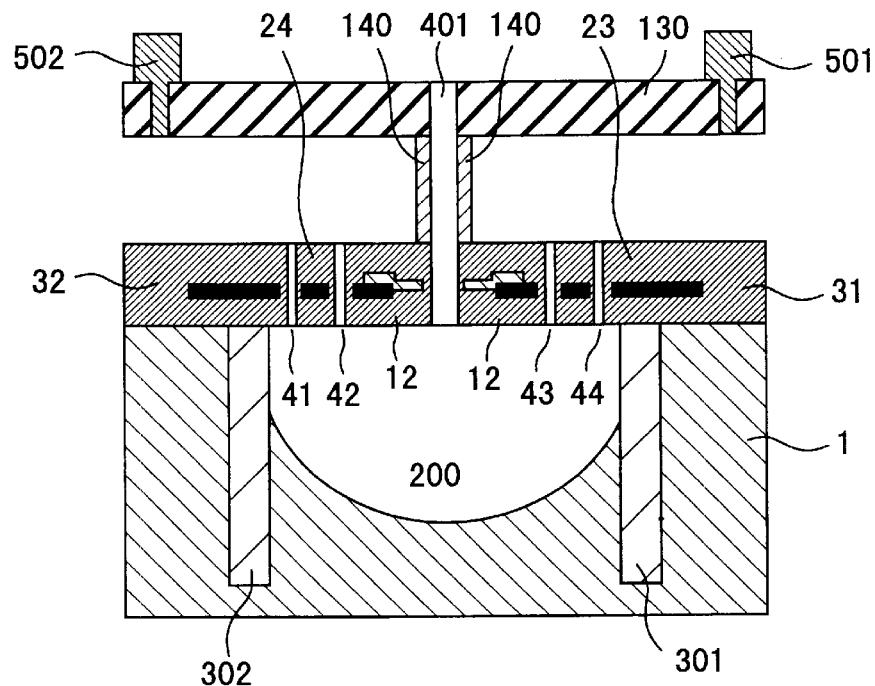

When the dry etching proceeds further, etching of the sacrifice layer 110 is also started through the etching holes 41, 42, 43 and 44, and hollow portions are formed above and under the insulating film 12 (see FIG. 6). Etching of the hollow portion 200 proceeds from the region right beneath the splicing pillar 140 located in the middle and results in a configuration which is shallowest at the periphery thereof. Therefore, a problem will not occur in that etching proceeds beyond the etching stoppers 301 and 302 even if the etching stoppers are shallower than those in the prior art.

Figure 7:
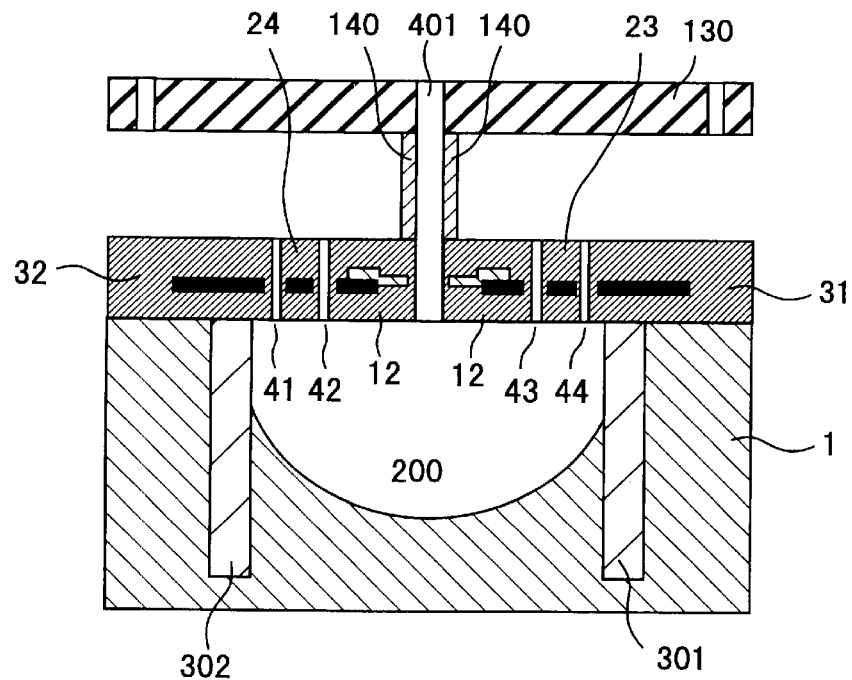

Finally, the protective films 501 and 502 made of resist or polyimide are removed using an oxygen ($O_2$) plasma process to complete a pixel structure (see FIG. 7).

While resist is used for the protective films 501 and 502 in the first embodiment, those portions obviously provide the same effect even if a material other than resist is used provided that the material is not etched by the gas for etching the sacrifice layer 110 and silicon substrate 1 and that the silicon substrate 1 is not etched when the material is etched.

According to the above-described manufacturing method, since the etching in the silicon substrate 1 most actively proceeds around the region right beneath the splicing pillar 140, a configuration is obtained which is deepest in the middle thereof and which gradually becomes shallower toward the periphery to reach a minimum depth at the etching stoppers 301 and 302. It is therefore possible to use etching stoppers which are shallower than those in conventional methods of manufacture. This makes it possible to avoid problems with conventional methods of manufacture that occur when deep etching stoppers are formed, i.e., an increase in the etching time attributable to the formation of a deep trench, the difficulty of etching with a high aspect ratio and the difficulty of the formation of an embedded trench, thereby allowing stable manufacture of semiconductor devices such as the uncooled infrared image sensor as specifically described in the first embodiment.

Second Embodiment

Figure 8:
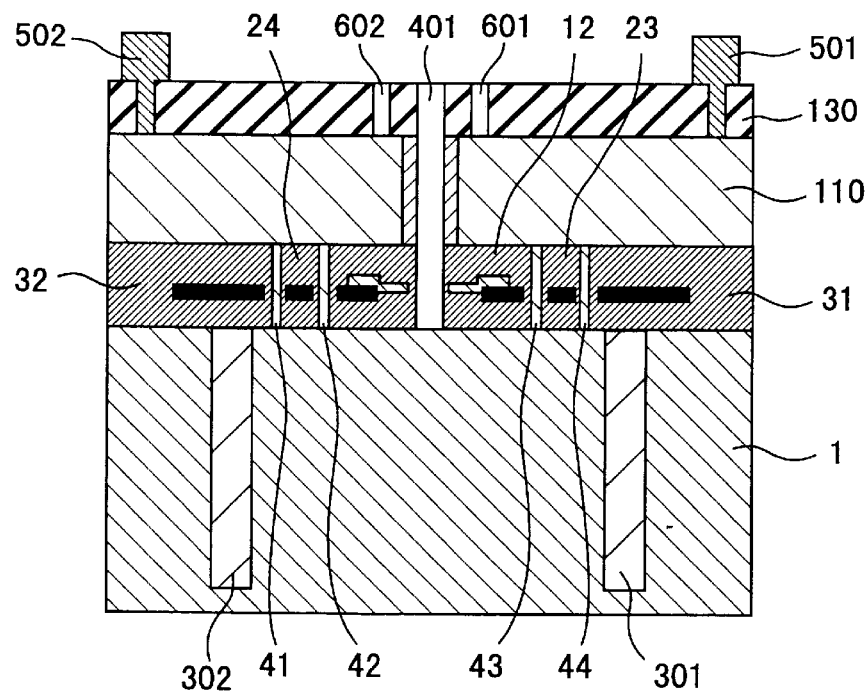
FIGS. 8 is a cross sectional view of a pixel structure of an uncooled infrared image sensor showing a method of manufacturing a semiconductor device according to a second embodiment of the invention.

FIG. 8 shows a second embodiment of the invention, that is, a cross sectional view of an uncooled infrared image sensor showing a second embodiment of the invention. FIG. 8 is a view of a cross sectional structure before a hollow portion of a silicon substrate 1 and a sacrifice layer 110 are etched.

According to the second embodiment, the structure of the first embodiment is added with etching holes 601 and 602 which are provided in an infrared absorbing portion 130 to allow etching of the sacrifice layer 110 to be started at the initial stage of etching. In such a structure, when the silicon substrate 1 is etched using an etching gas such as $XeF_2$, the sacrifice layer 110 is simultaneously etched through the etching hole 601. As a result, the etching is completed in an etching time shorter than that in the first embodiment, and it is therefore possible to manufacture semiconductor devices such as uncooled infrared image sensors with improved efficiency.

Third Embodiment

FIGS. 9 through 13 are a series of cross sectional views showing a method of manufacturing a pixel of an uncooled infrared image sensor according to a third embodiment of the invention.

Figure 9:
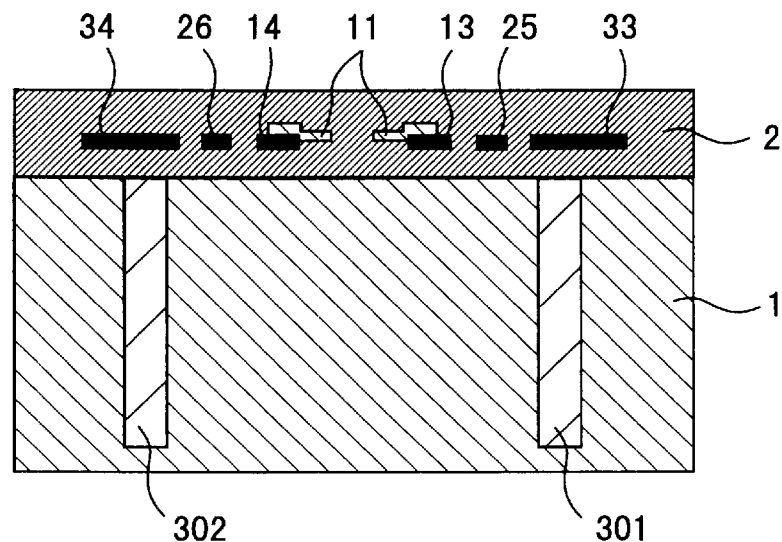
FIG. 9–13 are cross sectional views of a pixel structure of an uncooled infrared image sensor showing a method of manufacturing a semiconductor device according to a third embodiment of the invention.
Figure 10:
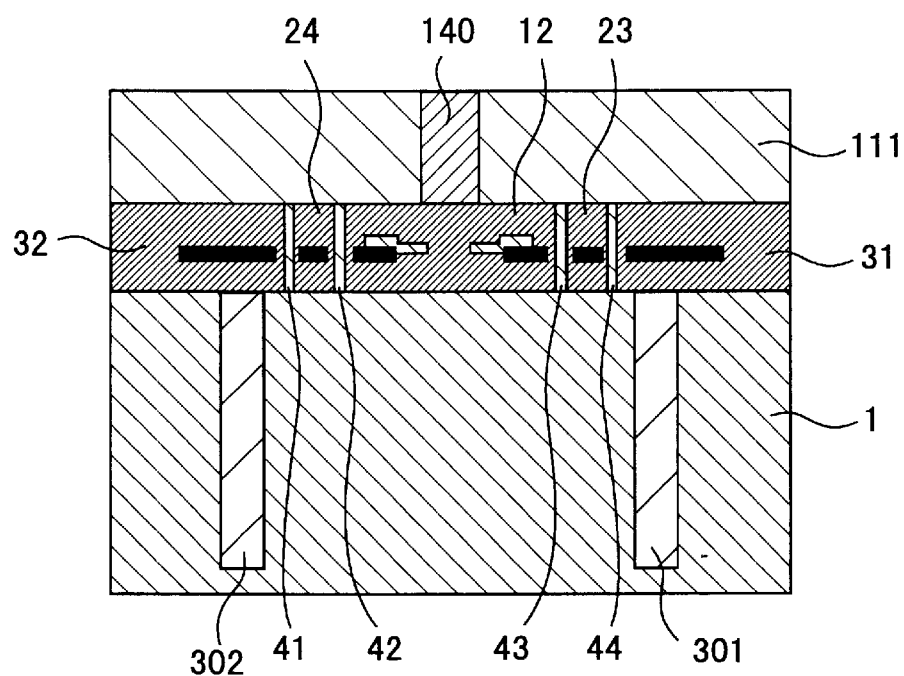

FIG. 9 is identical to FIG. 1 for the first embodiment, and FIG. 10 corresponds to FIG. 2. This embodiment is different from the first embodiment in that a sacrifice layer 111 is made of polyimide or the like which is not etched by an etching gas such as $XeF_2$ for etching a silicon substrate 1.

While the first embodiment has referred to a silicon dioxide film as an example of an insulating film 2, a silicon dioxide film may be used as the sacrifice layer 111 if a silicon nitride film is used instead of a silicon dioxide film. In this case, the sacrifice layer 111 may be etched using a mixture of hydrogen fluoride gas (HF) and methanol gas ($CH_3OH$).

Figure 11:
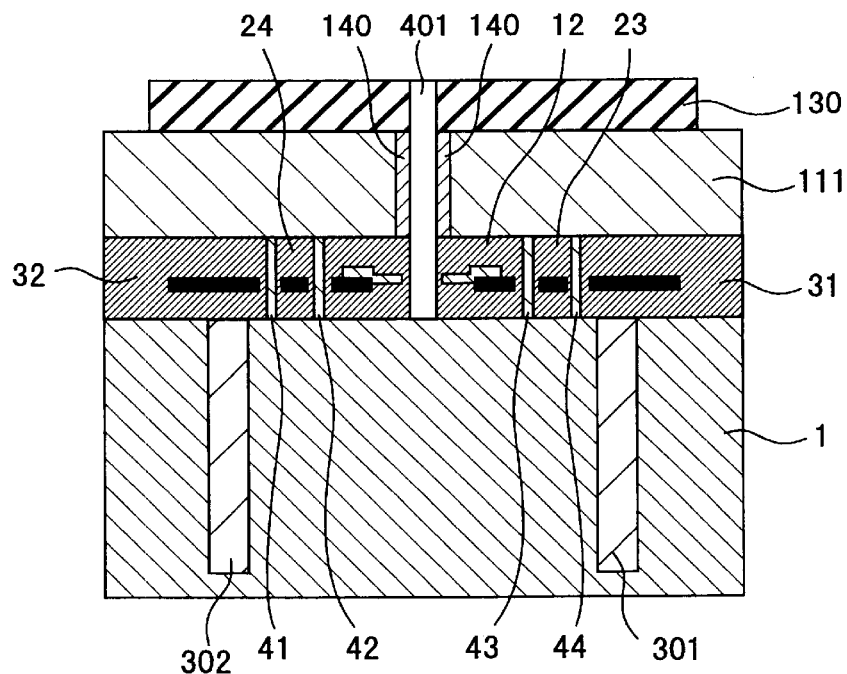
Figure 12:
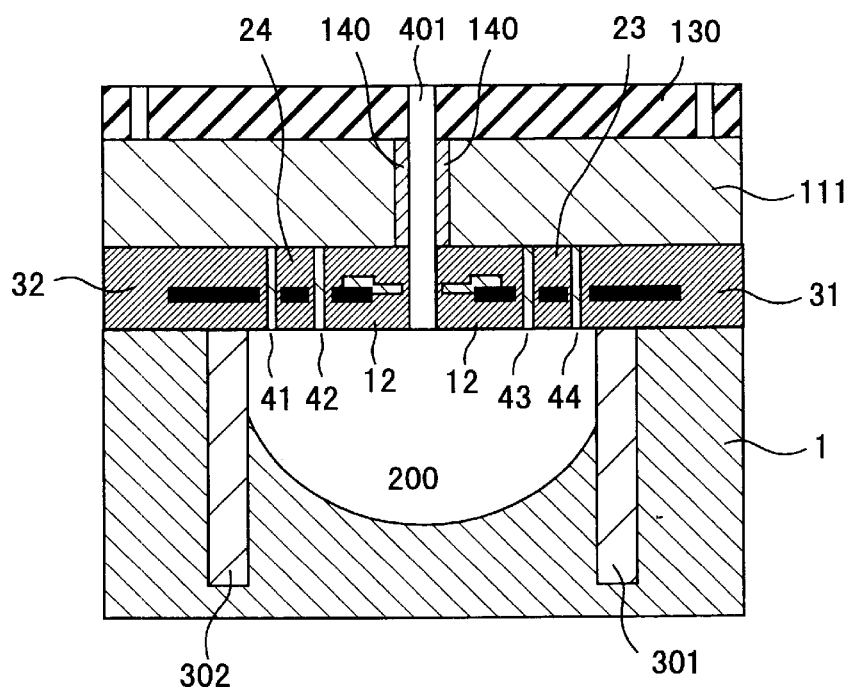

After an infrared ray absorbing portion 130 is formed on a wafer as shown in FIG. 10, etching is performed as shown in FIG. 11 to form an etching hole 401 which penetrates the infrared ray absorbing portion 130, a splicing pillar 140 and an insulating film 12 to reach the silicon substrate 1 at the bottom thereof.

An etching gas is introduced through the etching hole 401 in the splicing pillar 140 to etch the silicon substrate 1. An etching gas such as $XeF_2$ is used for the dry etching as in the first embodiment. The etching proceeds such that a largest depth is achieved right beneath the splicing pillar 140 (see FIG. 12). The sacrifice layer 111 is exposed on the surface of the wafer at peripheral regions of the infrared ray absorbing portion 130 which are spaces for separating each infrared ray absorbing portion and is exposed to the etching gas such as $XeF_2$. However, since the polyimde or the like that is the material forming the sacrifice layer 111 is not etched because it exhibits an etching resistant property against the etching gas such as $XeF_2$.

Figure 13:
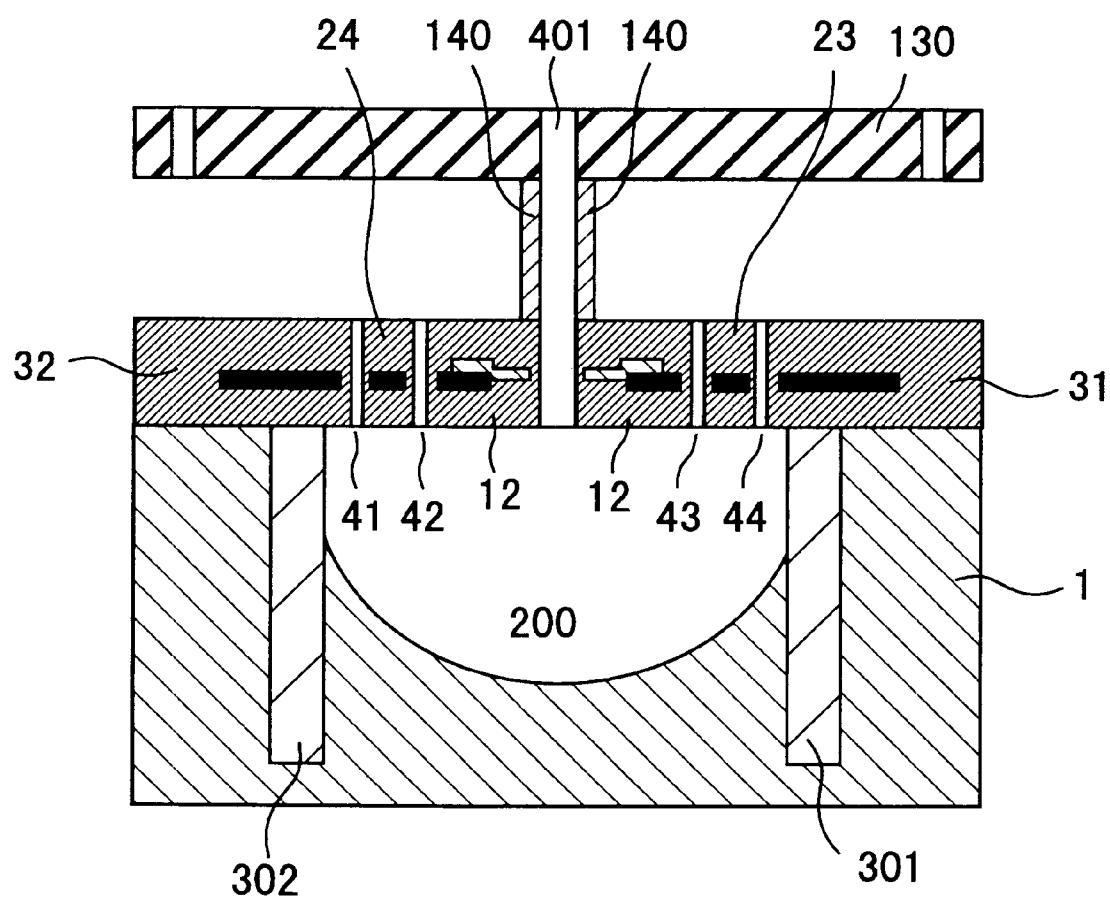
Figure 14A:
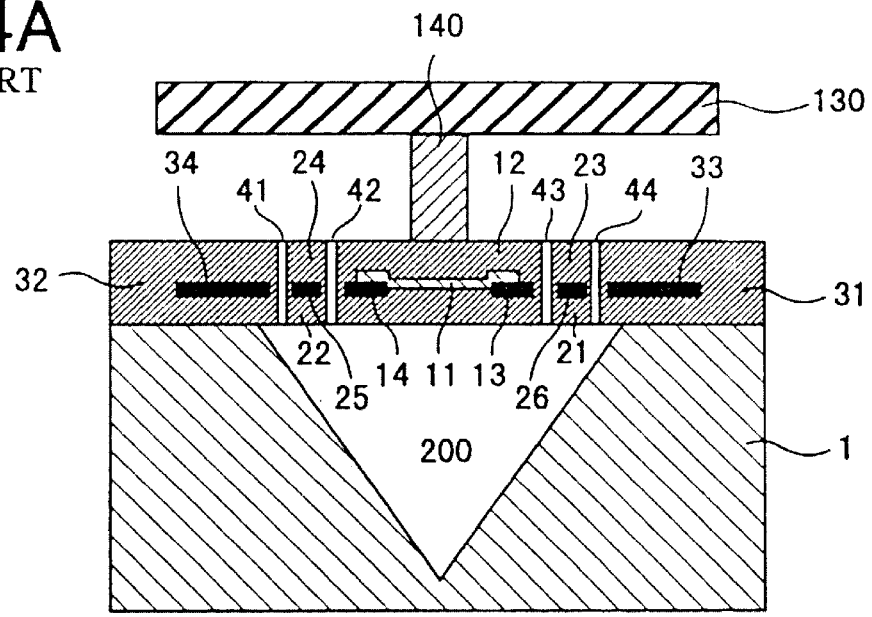
FIG. 14A is a cross sectional view of a pixel structure of an uncooled infrared image sensor according to a conventional technique.
Figure 14B:
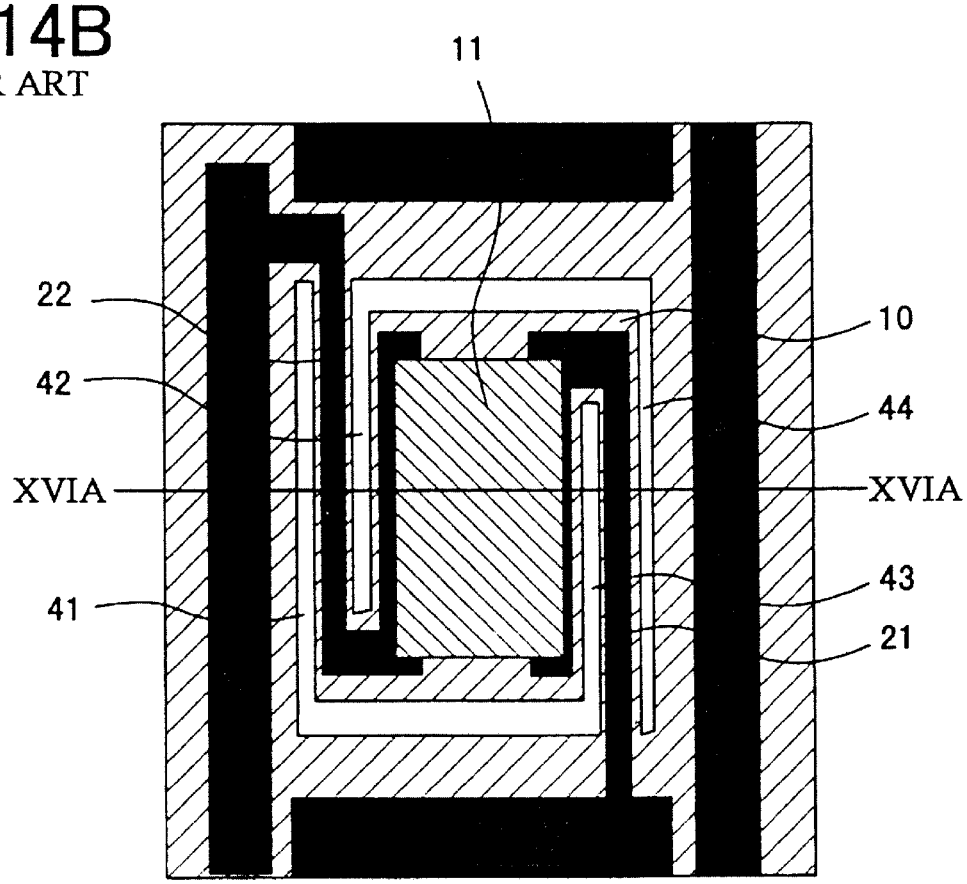
FIG. 14B is a plan view of the same.
Figure 15:
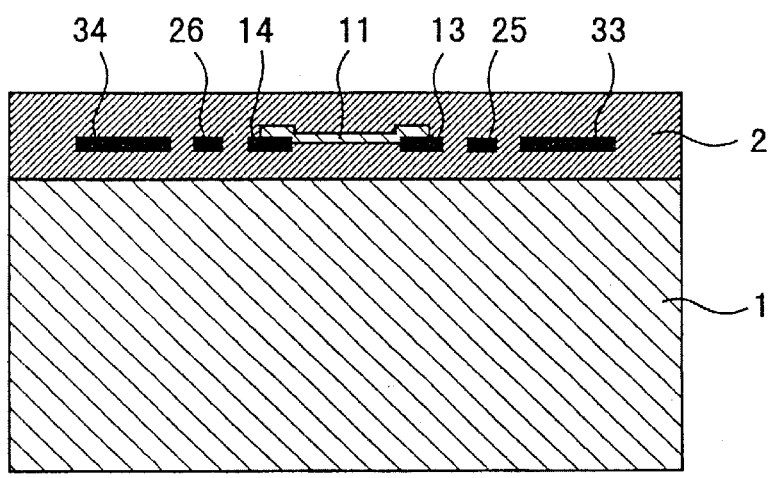
FIGS. 15–19 are cross sectional views of a pixel structure of an uncooled infrared image sensor showing parts of a flow of manufacture of a semiconductor device according to the conventional technique.
Figure 16:
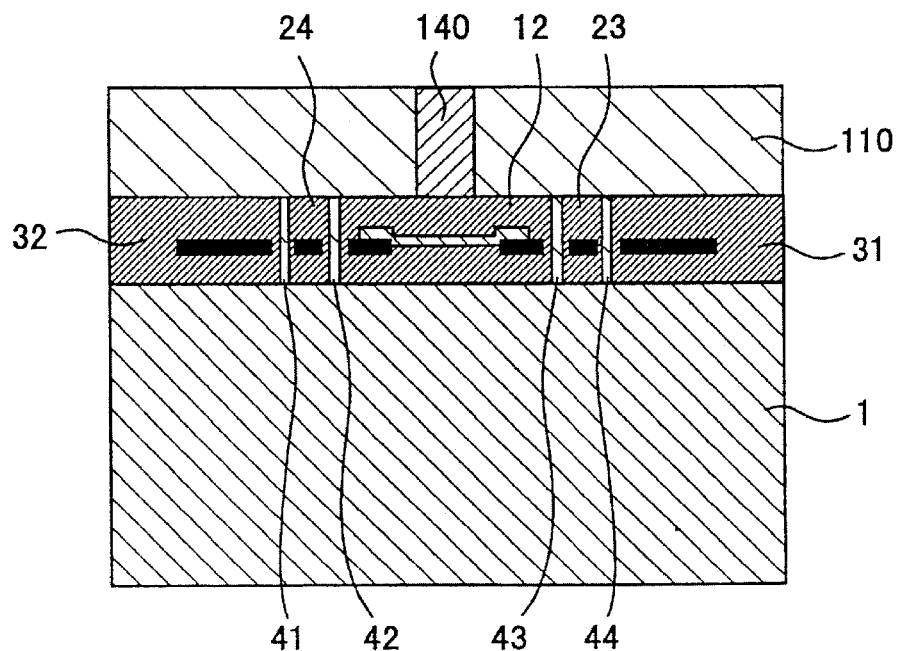
Figure 17:
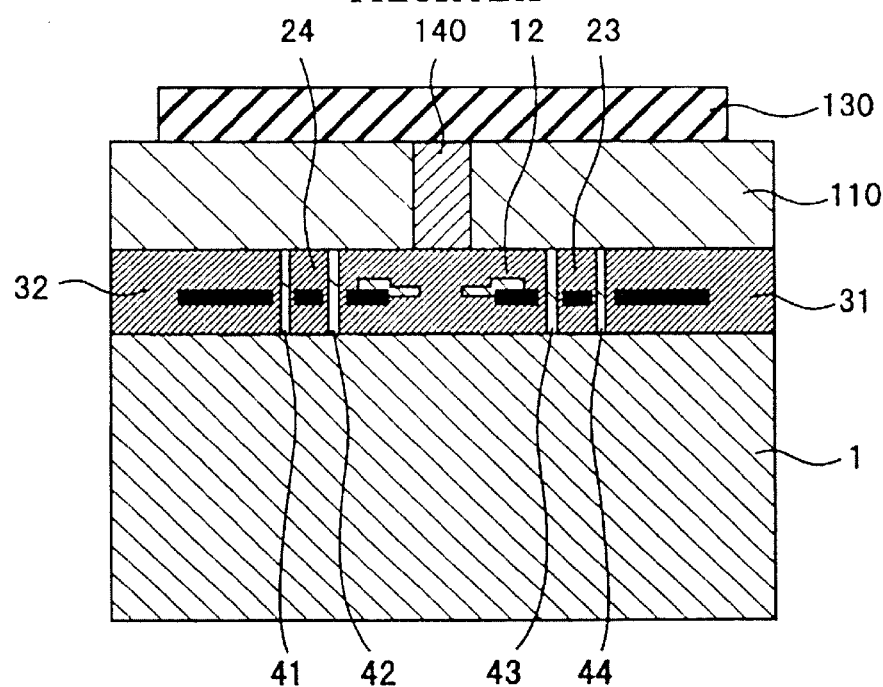
Figure 18:
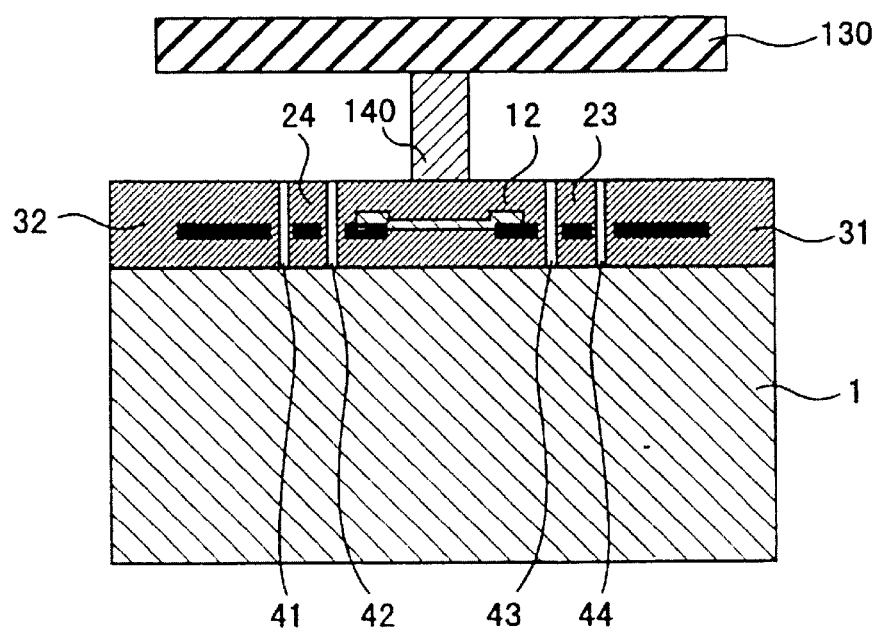
Figure 19:
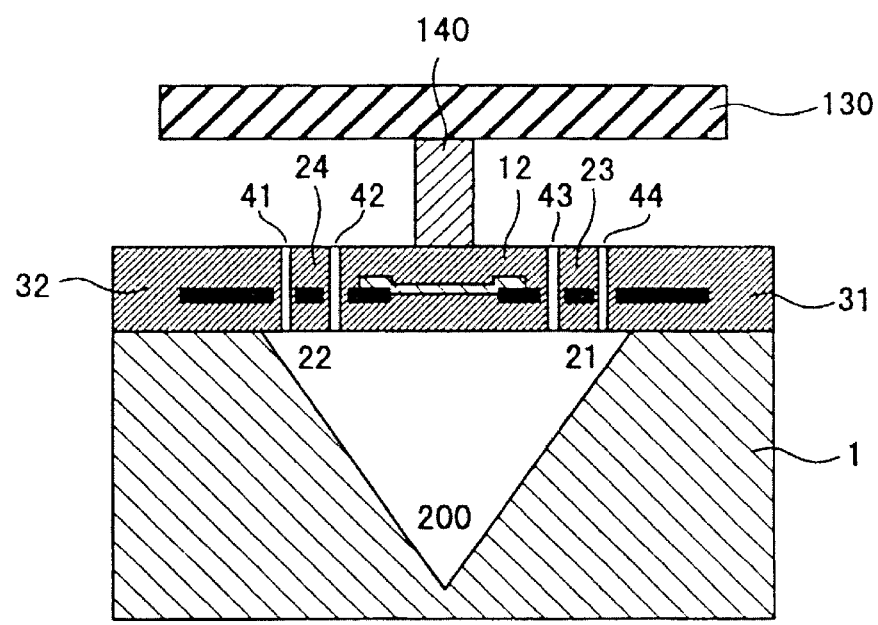
Figure 20:
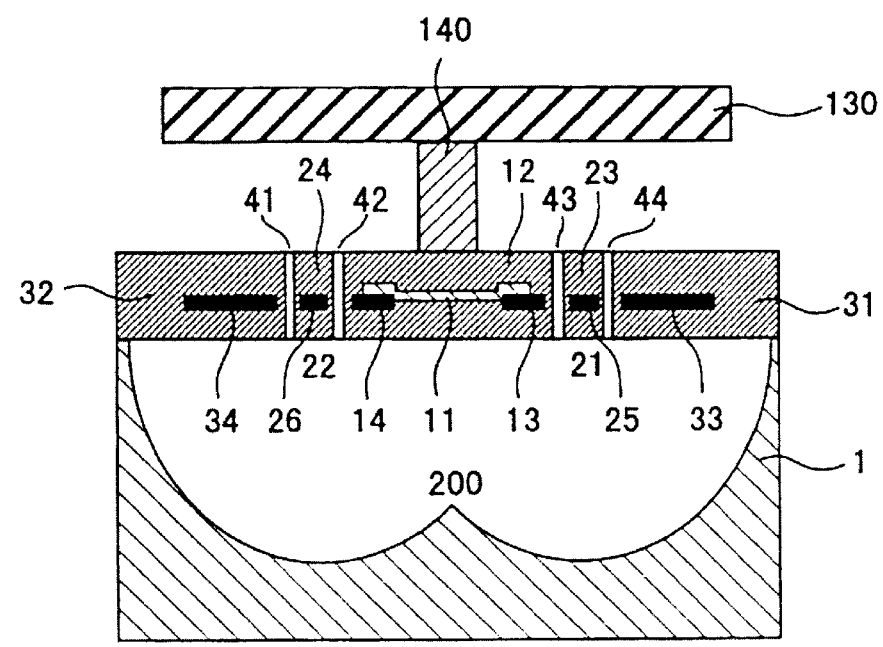
FIG. 20 is a cross sectional view of a pixel structure of an uncooled infrared image sensor according to a conventional technique utilizing dry etching.
Figure 21:
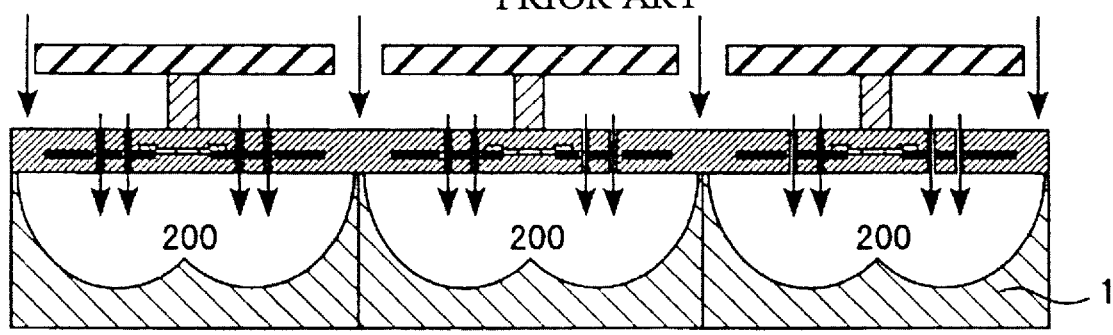
FIG. 21 is a cross sectional view of an array of uncooled infrared image sensors for a plurality of pixels according to the conventional technique shown in FIG. 20.
Figure 22:
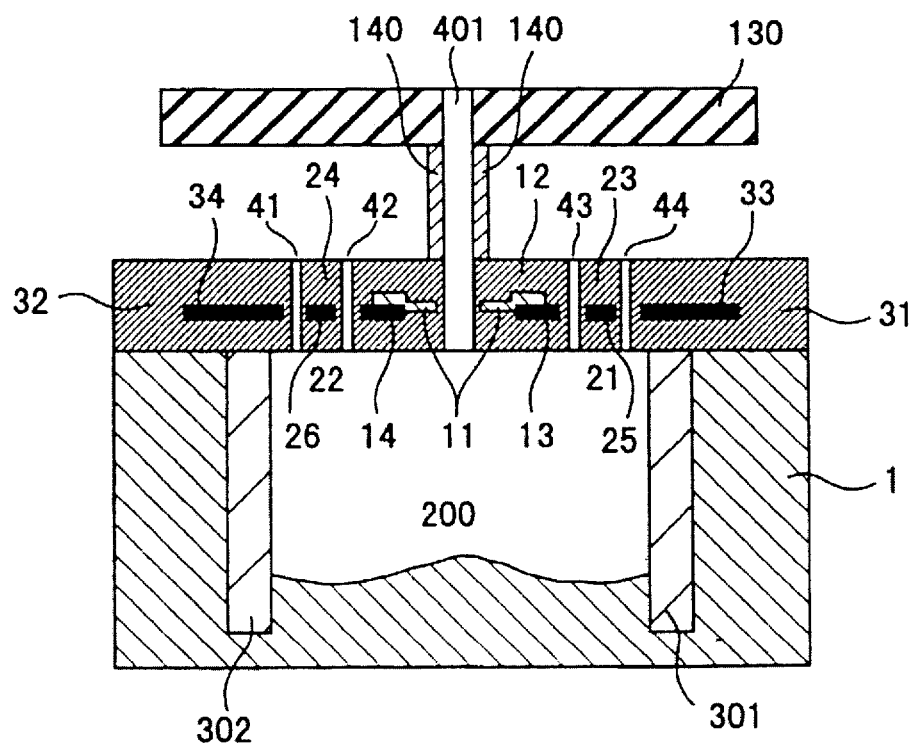
FIG. 22 is a cross sectional view of a pixel structure which is obtained by processing a pixel of a conventional uncooled infrared image sensor having an etching hole in the vicinity of the center of the pixel using a dry process.

After a hollow portion 200 is formed in the silicon substrate 1, a simple process such as an $O_2$ plasma process is used to remove the sacrifice layer 111 made of polyimide. At this time, since the silicon substrate 1 is not etched by the $O_2$ plasma at all, the hollow portion 200 maintains the etching configuration formed by the etching gas. The removal of the sacrifice layer 111 completes an uncooled infrared image sensor having a cross sectional structure as shown in FIG. 13. The use of such a manufacturing method makes it possible to remove only the sacrifice layer separately using a simple process.

The method of manufacturing a semiconductor device having a plurality of unit element regions according to the invention has the steps of: forming an etching stopper portion embedded in a semiconductor substrate for each unit element region; the etching stopper portion located at a predetermined distance from the center of the unit element region; forming a first structure on a surface of the semiconductor substrate in the unit element region; forming at least one first etching hole in the first structure located in between the neighborhood of center of the first structure and the location of the etching stopper portion, the first etching hole penetrating the first structure to reach the semiconductor substrate; forming a sacrifice layer on the first structure; forming at least one splicing pillar which penetrates the sacrifice layer to reach the first structure; forming a second structure on the sacrifice layer; forming a second etching hole which penetrates the second structure, the splicing pillar and the first structure to reach the semiconductor substrate, the second etching hole being along with the central axis of the splicing pillar; introducing an etching gas through the second etching hole to etch the semiconductor substrate thereby forming a hollow portion which is configured such that it has a largest depth right beneath the splicing pillar, gradually becomes shallower toward the etching stopper portion and has smallest depth where the hollow portion is in contact with the etching stopper portion; sequentially etching the sacrifice layer with the etching gas which is supplied through the first etching hole from the hollow portion concurrently with progress of etching of the semiconductor substrate. This eliminates problems such as sticking which can occur when a hollow portion is formed using wet etching and eliminates the need for forming deep etching stoppers. It is therefore possible to fabricate a semiconductor device with high reproducibility because it is possible to avoid an increase in the etching time attributable to the formation of a deep trench, the difficulty of etching with a high aspect ratio and the difficulty of the formation of an embedded trench.

The method of manufacturing an infrared image sensor having a plurality of unit element regions according to the invention has the steps of: forming an etching stopper portion embedded in a semiconductor substrate for each unit element region, the etching stopper portion located at a predetermined distance from the center of the unit element region; forming an insulating film portion having a metal wiring and a temperature sensor embedded therein on a surface of the semiconductor substrate in the unit element region; forming at least one first etching hole in the insulating film portion located in between the neighborhood of center of the insulating film portion and the location of the etching stopper portion, the first etching hole penetrating the insulating portion film to reach the semiconductor substrate; forming a sacrifice layer on the insulating film portion; forming at least one splicing pillar which penetrates the sacrifice layer to reach the insulating film portion; forming an infrared absorbing portion on the sacrifice layer; forming a second etching hole which penetrates the infrared absorbing portion, the splicing pillar and the insulating film portion to reach the semiconductor substrate, the second etching hole being along with the central axis of the splicing pillar; introducing an etching gas through the second etching hole to etch the semiconductor substrate thereby forming a hollow portion which is configured such that it has a largest depth right beneath the splicing pillar, gradually becomes shallower toward the etching stopper portion and has smallest depth where the hollow portion is in contact with the etching stopper portion; sequentially etching the sacrifice layer with the etching gas which is supplied through the first etching hole from the hollow portion concurrently with progress of etching of the semiconductor substrate. Since there is no need for providing deep etching stoppers during fabrication, an infrared image sensor can be manufactured with high yield.

Another method of manufacturing the infrared image sensor according to the invention has the steps of: forming a third etching hole whose bottom reaches the sacrifice layer through said infrared absorbing portion; and introducing an etching gas through the second etching hole to etch the semiconductor substrate thereby forming a hollow portion and simultaneously introducing an etching gas through the third etching hole to etch the sacrifice layer. Since the sacrifice layer is sequentially etched concurrently with the progress of the etching of the silicon substrate. It is therefore possible to fabricate a semiconductor device in a short etching time and to manufacture a semiconductor device such as an uncooled infrared image sensor with improved efficiency.

Another method of manufacturing the infrared image sensor having a plurality of unit element regions according to the invention has the steps of: forming an etching stopper portion embedded in a semiconductor substrate for each unit element region, the etching stopper portion located at a predetermined distance from the center of the unit element region; forming an insulating film portion having a metal wiring and a temperature sensor embedded therein on a surface of the semiconductor substrate in the unit element region; forming at least one first etching hole in the insulating film portion located in between the neighborhood of center of the insulating film portion and the location of the etching stopper portion, the first etching hole penetrating the insulating film portion to reach the semiconductor substrate; forming a sacrifice layer on the insulating film portion; forming at least one splicing pillar which penetrates the sacrifice layer to reach the insulating film portion; forming an infrared absorbing portion on the sacrifice layer; forming a second etching hole which penetrates the infrared absorbing portion, the splicing pillar and the insulating film portion to reach the semiconductor substrate, the second etching hole being along with the central axis of the splicing pillar; introducing an etching gas through the second etching hole to etch the semiconductor substrate thereby forming a hollow portion which is configured such that it has a largest depth right beneath the splicing pillar, gradually becomes shallower toward the etching stopper portion and has smallest depth where the hollow portion is in contact with the etching stopper portion; selectively etching the sacrifice layer after the hollow portion is formed. This eliminates the need for providing deep etching stoppers during fabrication and makes it possible to remove only the sacrifice layer separately using a simple process.

Further, in the method of manufacturing the infrared image sensor according to the invention, the above-described sacrifice layer may be formed of resist or polyimide which is a material exhibiting an etching resistant property against an etching gas, which makes it possible to remove only the sacrifice layer separately using a simple process.

Further, in the method of manufacturing the infrared image sensor according to the invention, the sacrifice layer may be constituted by a silicon nitride film and may be etched using an etching gas which is a mixture of hydrogen fluoride (HF) and methanol ($CH_3OH$). This makes it possible to remove only the sacrifice layer by means of etching with the configuration of the hollow portion provided in the semiconductor substrate kept unchanged.

Further more, in the method of manufacturing the infrared image sensor according to the invention, the above-described etching gas may comprise a gaseous material selected from the group consisting of $XeF_2$, $XeF_4$, $XeF_6$, $KrF_2$, $KrF_4$, $KrF_6$, $ClF_3$, $BrF_3$, $BrF_5$, $IF_5$ and a mixture thereof. It is therefore possible to perform isotropic dry etching of the silicon substrate.

What is claimed is:

1. A method of manufacturing a semiconductor device having a plurality of unit element regions, comprising:

forming an etching stopper portion embedded in a semiconductor substrate for each unit element region, said etching stopper portion being located at a distance from a center of said unit element region;

forming a first structure on a surface of said semiconductor substrate in said unit element region;

forming at least one first etching hole in said first structure located between a center of said first structure and said etching stopper portion, said first etching hole penetrating said first structure and reaching said semiconductor substrate;

forming a sacrificial layer on said first structure;

forming at least one splicing pillar which penetrates said sacrificial layer and reaches said first structure;

forming a second structure on said sacrificial layer;

forming a second etching hole which penetrates said second structure, said splicing pillar, and said first structure, and reaches said semiconductor substrate, said second etching hole being aligned with a central axis of said splicing pillar;

introducing an etching gas through said second etching hole and etching said semiconductor substrate, forming a hollow portion which has a largest depth directly beneath said splicing pillar, gradually becomes shallower toward said etching stopper portion, and has a smallest depth where the hollow portion is in contact with said etching stopper portion; and sequentially etching said sacrificial layer with said etching gas, supplied through said first etching hole from said hollow portion, concurrently with etching of said semiconductor substrate.

2. The method of manufacturing a semiconductor device according to claim 1, wherein said sacrificial layer extends over said plurality of unit element regions, and including covering a portion of said sacrificial layer between said plurality of unit element regions with a protective film during the formation of said second etching hole and said hollow portion.

3. The method of manufacturing a semiconductor device according to claim 1, comprising:

forming a third etching hole having a bottom reaching said sacrificial layer through said second structure; and introducing an etching gas through said second etching hole and etching said semiconductor substrate, forming a hollow portion, and simultaneously introducing an etching gas through said third etching hole and etching said sacrificial layer.

4. The method of manufacturing a semiconductor device according to claim 1, wherein said etching gas comprises a gaseous material selected from the group consisting of $XeF_2$, $XeF_4$, $XeF_6$, $KrF_2$, $KrF_4$, $KrF_6$, $ClF_3$, $BrF_3$, $BrF_5$, $IF_5$, and mixtures thereof.

5. A method of manufacturing an infrared image sensor having a plurality of unit element regions, comprising:

forming an etching stopper portion embedded in a semiconductor substrate for each unit element region, said etching stopper portion being located at a distance from a center of said unit element region;

forming an insulating film portion, having a metal wiring and a temperature sensor embedded therein, on a surface of said semiconductor substrate in said unit element region;

forming at least one first etching hole in said insulating film portion located between a center of said insulating film portion and said etching stopper portion, said first etching hole penetrating said insulating portion film and reaching said semiconductor substrate;

forming a sacrificial layer on said insulating film portion;

forming at least one splicing pillar penetrating said sacrificial layer and reaching said insulating film portion;

forming an infrared absorbing portion on said sacrificial layer;

forming a second etching hole penetrating said infrared absorbing portion, said splicing pillar, and said insulating film portion, and reaching said semiconductor substrate, said second etching hole being aligned with a central axis of said splicing pillar; and introducing an etching gas through said second etching hole and etching said semiconductor substrate, forming a hollow portion which has a largest depth directly beneath said splicing pillar, gradually becomes shallower toward said etching stopper portion, and has a smallest depth where the hollow portion is in contact with said etching stopper portion, sequentially etching said sacrificial layer with said etching gas, supplied through said first etching hole from said hollow portion, concurrently with etching of said semiconductor substrate.

6. The method of manufacturing an infrared image sensor according to claim 5, wherein said sacrificial layer extends over said plurality of unit element regions, and including covering a portion of said sacrificial layer between said plurality of unit element regions with a protective film during the formation of said second etching hole and said hollow portion.

7. The method of manufacturing a semiconductor device according to claim 5, comprising:

forming a third etching hole having a bottom reaching said sacrificial layer through said infrared absorbing portion; and introducing an etching gas through said second etching hole and etching said semiconductor substrate, forming a hollow portion, and simultaneously introducing an etching gas through said third etching hole and etching said sacrificial layer.

8. The method of manufacturing a semiconductor device according to claim 5, wherein said etching gas comprises a gaseous material selected from the group consisting of $XeF_2$, $XeF_4$, $XeF_6$, $KrF_2$, $KrF_4$, $KrF_6$, $ClF_3$, $BrF_3$, $BrF_5$, $IF_5$, and mixtures thereof.

9. A method of manufacturing an infrared image sensor having a plurality of unit element regions, comprising:

forming an etching stopper portion embedded in a semiconductor substrate for each unit element region, said etching stopper portion being located at a distance from a center of said unit element region;

forming an insulating film portion, having a metal wiring and a temperature sensor embedded therein, on a surface of said semiconductor substrate in said unit element region;

forming at least one first etching hole in said insulating film portion located between a center of said insulating film portion and said etching stopper portion, said first etching hole penetrating said insulating portion film and reaching said semiconductor substrate;

forming a sacrificial layer on said insulating film portion;

forming at least one splicing pillar penetrating said sacrificial layer and reaching said insulating film portion;

forming an infrared absorbing portion on said sacrificial layer;

forming a second etching hole penetrating said infrared absorbing portion, said splicing pillar, and said insulating film portion, and reaching said semiconductor substrate, said second etching hole being aligned with a central axis of said splicing pillar;

introducing an etching gas through said second etching hole and etching said semiconductor substrate, forming a hollow portion which has a largest depth directly beneath said splicing pillar, gradually becomes shallower toward said etching stopper portion, and has a smallest depth where the hollow portion is in contact with said etching stopper portion; and selectively etching said sacrificial layer after said hollow portion is formed.

10. The method of manufacturing an infrared image sensor according to claim 9, wherein said sacrificial layer is a material exhibiting an etching resistant to etching by said etching gas.

11. The method of manufacturing an infrared image sensor according to claim 9, wherein said sacrificial layer is a silicon nitride and is selectively etched using an etching gas which is a mixture of hydrogen fluoride and methanol.

12. The method of manufacturing an infrared image sensor according to claim 9, wherein said etching gas comprises a gaseous material selected from the group consisting of $XeF_2$, $XeF_4$, $XeF_6$, $KrF_2$, $KrF_4$, $KrF_6$, $ClF_3$, $BrF_3$, $BrF_5$, $IF_5$, and mixtures thereof.

13. The method of manufacturing an infrared image sensor according to claim 9, wherein the material is selected from the group consisting of resist and polyimide.

14. A method of manufacturing a semiconductor device comprising:

forming a first element layer on a surface of a semiconductor substrate in a unit element region;

forming at least one first etching hole in said first element layer at a location of said unit element region, said first etching hole penetrating said first element layer and reaching said semiconductor substrate;

forming a sacrificial layer on said first element layer;

forming at least one through-hole in said sacrificial layer at a different location from that of said first etching hole, and filling said through-hole with a material to form a splicing pillar which penetrates said sacrificial layer to reach said first element layer;

forming a second element layer on said sacrificial layer;

forming a second etching hole which penetrates said second element layer, said splicing pillar, and said first element layer, and reaches said semiconductor substrate;

introducing an etching gas through said second etching hole and etching said semiconductor substrate, forming a hollow portion in said semiconductor substrate; and etching said sacrificial layer with an etching gas introduced through said second etching hole and supplied through said hollow portion and said first etching hole.

15. The method of manufacturing a semiconductor device according to claim 14, including etching said sacrificial layer concurrently with etching of said semiconductor substrate.

16. The method of manufacturing a semiconductor device according to claim 14, wherein said sacrificial layer extends over said plurality of unit element regions, and including covering a portion of said sacrificial layer between said plurality of unit element regions with a protective film during the formation of said second etching hole and said hollow portion.

17. The method of manufacturing a semiconductor device according to claim 14, comprising:

forming a third etching hole having a bottom reaching said sacrificial layer through said second element layer; and introducing an etching gas through said second etching hole and etching said semiconductor substrate, forming a hollow portion and simultaneously introducing an etching gas through said third etching hole and etching said sacrificial layer.

18. The method of manufacturing a semiconductor device according to claim 14, wherein said etching gas comprises a gaseous material selected from the group consisting of $XeF_2$, $XeF_4$, $XeF_6$, $KrF_2$, $KrF_4$, $KrF_6$, $ClF_3$, $BrF_3$, $BrF_5$, $IF_5$, and mixtures thereof.

* * * * *